United States Patent
Guzman-Casillas et al.

(10) Patent No.: US 6,603,298 B2
(45) Date of Patent: Aug. 5, 2003

(54) SYSTEM FOR ESTIMATING THE FREQUENCY OF THE POWER SIGNAL ON A POWER TRANSMISSION LINE

(75) Inventors: Armando Guzman-Casillas, Pullman, WA (US); Gabriel Benmouyal, Boucherville (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 09/900,105

(22) Filed: Jul. 6, 2001

(65) Prior Publication Data

US 2003/0011352 A1 Jan. 16, 2003

(51) Int. Cl.[7] .............................................. G01R 23/02
(52) U.S. Cl. .................................................. 324/76.39
(58) Field of Search ........................ 324/76.39, 76.53, 324/86, 107; 361/62, 65, 79, 88, 90, 91.1; 307/64, 87; 363/160

(56) References Cited

U.S. PATENT DOCUMENTS

| | | | | | |
|---|---|---|---|---|---|
| 4,636,909 A | * | 1/1987 | Brandt | ......................... | 361/80 |
| 4,672,501 A | * | 6/1987 | Bilac et al. | .................... | 361/96 |
| 6,426,856 B1 | * | 7/2002 | Schneerson et al. | .......... | 361/79 |

* cited by examiner

Primary Examiner—Safet Metjahic
Assistant Examiner—Etienne P. LeRoux
(74) Attorney, Agent, or Firm—Jensen & Puntigam, P.S.

(57) ABSTRACT

The system obtains the three phase voltages on the power line $V_A$, $V_B$ and $V_C$, either from a local primary or local alternative source. The selected local source voltages are then applied through switches, respectively, which are normally closed but are open in the event that the associated pole of each voltage phase is open. The voltages from the closed switches are applied to a calculating circuit which produces a composite of the three voltages in accordance with a preselected formula. The composite voltage output is then normalized and applied to a conventional frequency determination (estimating) circuit. This output is an accurate system frequency for use by the protective relay.

9 Claims, 2 Drawing Sheets

| SW28 POSITION | SW29 POSITION | SW30 POSITION | K |
|---|---|---|---|
| 2 | 2 | 2 | 2/3 |
| 1 | 2 | 2 | 2 |
| 2 | 1 | 2 | $2/\sqrt{7}$ |
| 2 | 2 | 1 | $2/\sqrt{7}$ |
| 2 | 1 | 1 | 1 |
| 1 | 2 | 1 | 2 |
| 1 | 1 | 2 | 2 |
| 1 | 1 | 1 | 2/3 |

FIG.2

SYSTEM FOR ESTIMATING THE FREQUENCY OF THE POWER SIGNAL ON A POWER TRANSMISSION LINE

TECHNICAL FIELD

This invention relates generally to determination of the power signal frequency for use in protective relay operations, and more specifically concerns a system for maintaining the accuracy of the power system frequency determination if one or more of the individual phase voltage poles are open, or if there are other error conditions in the power system or power system instrumentation transformers.

BACKGROUND OF THE INVENTION

Protection functions for an electric power system, such as carried out by a protective relay, other protection or monitoring device, often require an accurate knowledge of the power system frequency, i.e. the frequency of the power signal being provided to the system's customers. Misoperations of a protective relay can occur if the system frequency is not accurately known and tracked, as the frequency may change from nominal frequency. A memory polarized distance element is an example of a protective element in a relay which can misoperate if the system frequency is not accurately tracked. Accurate frequency information is important in a number of protection operations.

Power system frequency can be affected by a number of factors, including operating stress on the system due to high demand, as well as other factors, such as a sudden mismatch of generation to load caused by the liberation of a system fault and the resulting increase in system transfer impedance. Frequency is generally determined by selecting a single phase of the voltage on the power line, usually A-phase, and then making a system frequency determination from that voltage signal, based on the frequency of that single phase voltage. The frequency determination can be accomplished by any one of a number of conventional, well known frequency determining techniques.

Generally, such a system works well. However, if the selected phase voltage is de-energized, such as if the pole opened due to a single pole tripping operation, or if there is a fuse failure of the VT (voltage transformer) supplying that phase voltage to the device or if other factors produce a frequency distortion of that single phase voltage, the ability of the present system to produce an accurate determination of system frequency is severely impaired, if not eliminated. For instance, an open pole or blown VT fuse will result in a lack of frequency determination. The occurrence of these events does not, however, remove the protective device from service nor decrease the need for these devices to fulfill their functions of protection and monitoring.

Hence, it is desirable to increase the reliability and accuracy of power system frequency determinations, because of the importance of such frequency information to the correct operation of many protective functions with protective relays.

DISCLOSURE OF THE INVENTION

Accordingly, the present invention is a system for determining the power system frequency which is used in the protective relay operations for protection and/or monitoring of the power system, comprising: means for obtaining three phase voltages on the power line by elements which are local to the protective relay; a calculating circuit for producing a composite voltage of the three phase voltages in accordance with a preselected equation; and means for estimating the power system frequency from the composite voltage, wherein said power system frequency is used by the protective relay in its protective functions for the power system.

BRIEF DESCRIPTION OF THE DRAWINGS

FIG. 2 is a table showing the operation of one portion of the system of FIG. 1.

BEST MODE FOR CARRYING OUT THE INVENTION

Figure 1:
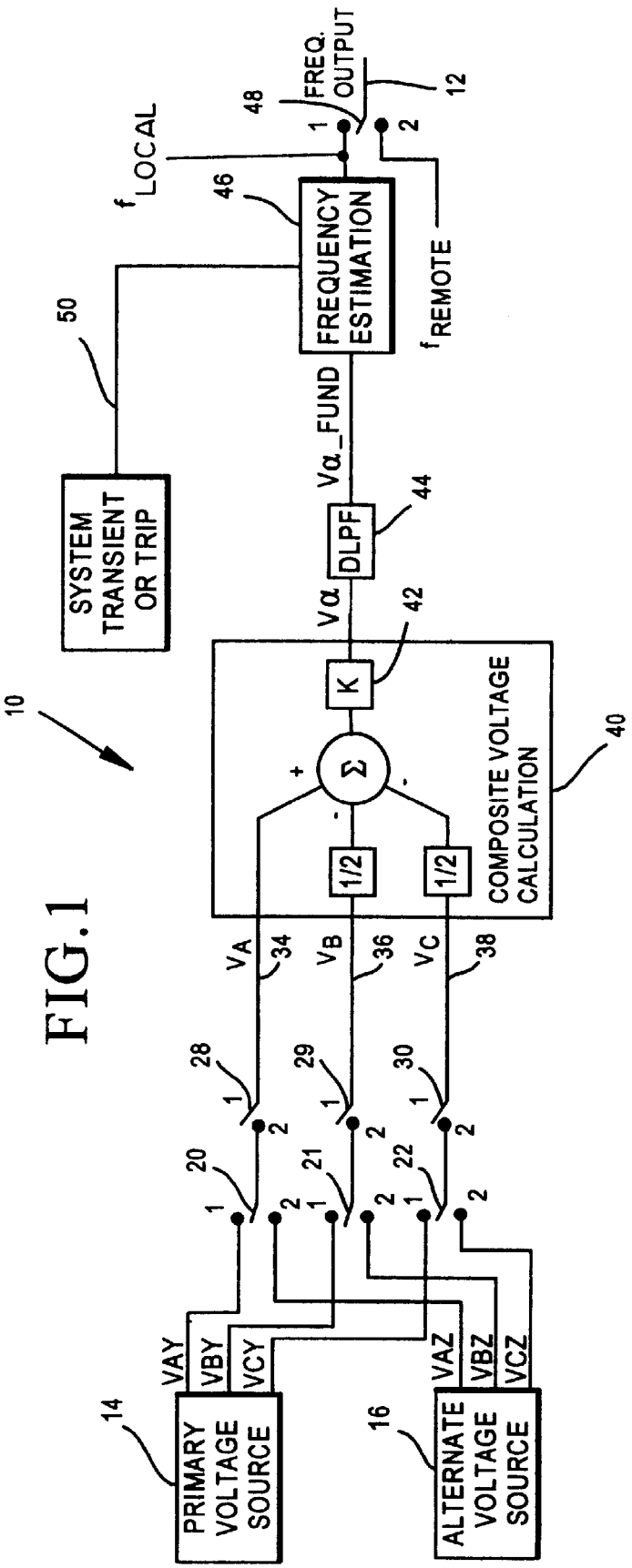
FIG. 1 is a block diagram showing the system of the present invention.

FIG. 1 shows the system 10 of the present invention, the system being used to develop a reliable determination of power system frequency on frequency output line 12, from three phase voltages ($V_A$, $V_B$ and $V_C$), provided either by a primary source 14 or an alternate source 16 from the power line. The respective voltages, primary and alternate, are labeled $V_{AY}$, $V_{BY}$ and $V_{CY}$ and $V_{AZ}$, $V_{BZ}$ and $V_{CZ}$ to identify the three phases and distinguish the two sources. The voltages are from two different sources of voltages from the power line.

Line switches 20–22 are associated, respectively, with each phase, to both primary and alternate sources and operate between two positions. Switches 20–22 are controlled to be in position 1 for the primary source, unless (1) an alternative source enable signal is provided, which means that an alternative source is available, if desired, and (2) an alternate source setting is actually provided by the relay, when an alternate source is in fact desired. Alternate sources are not, however, necessary to the invention.

The outputs from switches 20, 21 and 22 are applied, respectively, to one side of switches 28–30. Switches 28–30 operate between two positions. Position 2 is the normal state or position of the switches, and they are in this position when the pole for the phase voltage is closed. Each phase of the source voltage will be applied directly through their associated switch 28–30 when these switches are in switch position 2.

The switches are moved to position 1, for each phase, under the following conditions. Switch 28 will be moved to position 1 independently when there is an A-phase pole open condition, a three-pole open condition or a loss of potential condition and the alternate source $V_A$ voltage is not available, as determined conventionally by the protective device. When switch 28 is in position 1 (open), there will be no voltage $V_A$ on line 34. Switch 29 will be moved to position 1 (open) when there is a B-phase pole open position, a three-pole open condition or loss of potential condition and the alternate source $V_B$ is not available, again as determined by the relay. When switch 29 is in position 1 (open), there will be no voltage on line 36. Otherwise, the voltage on line 36 will be the B-phase voltage $V_B$ from the source 14 (or source 16). Switch 30 is moved to position 1 (open) when there is a C-phase pole open position, a three-pole open condition or a loss of potential condition and the alternate source $V_C$ voltage is not available. When switch 30 is in its open position, there is no voltage on line 38, otherwise, the voltage is $V_C$ from the voltage source, either primary or alternate.

The voltages on lines 34, 36 and 38 (whether present or not) are applied to a composite voltage calculation circuit 40. The composite voltage calculator 40 produces a composite signal from the three voltage inputs on lines 34, 36 and 38 in accordance with the following expression:

$$V_\alpha = \left[V_A - \left(\frac{V_B + V_C}{2}\right)\right] \cdot K$$

K is a scaler quantity provided by element 42, the value of which depends upon the position of switches 28, 29 and 30 in accordance with the table of FIG. 2. The purpose of the scaler function K, which is an adaptive gain element, and which follows the particular power line operating conditions (in particular, the open/close position of the three poles) is to adjust the composite voltage value from the above expression to a constant magnitude signal which is applied to the remainder of the circuit of FIG. 1.

The output of voltage calculator circuit 40 $V_\alpha$ is applied to a conventional low pass filter 44 which filters out the higher harmonics of the input signal, leaving just the fundamental frequency portion of $V_\alpha$, referred to as $V_{\alpha fund}$. The $V_{\alpha fund}$ signal is applied to a frequency estimator 46. Estimator 46 is responsive to the applied voltage signal to produce an estimate (determination) of the frequency. The frequency estimation is conventional, and can either be done in hardware or software. Techniques include zero crossing, various filtering approaches, phase angle shift determination and still others. It should be understood that a wide variety of conventional techniques can be used to produce the estimate of the frequency from the $V_{\alpha fund}$ signal applied to it.

The output of frequency estimation circuit 46 is referred to as the local frequency $f_{LOCAL}$. When switch 48 is in its normal position (position 1), the $f_{LOCAL}$ signal is the system frequency output which is supplied to the protection algorithms of the relay.

The frequency estimation circuit 46 is responsive to a control signal 50 which "freezes" the estimated frequency value at the last determined value if the relay recognizes either a transient in the system operation, or there has been a trip signal provided by the relay. In such a case, the frequency estimation is maintained at the last value and will not change until the control signal 50 goes away.

Referring to switch 48, position 1 is selected when local, i.e. primary or alternate, voltage sources are available and operating. If neither of the local voltages, either primary or alternate, are available, then a remote frequency value ($f_{REMOTE}$) from another source can be used to produce the frequency output signal for the protection functions, when switch 48 is in position 2.

Hence, a system has been disclosed which maintains the reliability and accuracy of system frequency determinations, even when one of the phase voltages from which the decision has been made is eliminated because its associated pole is open. Other factors adversely affecting frequency can also be accommodated. The system calculates a composite of the three individual phase voltages $V_A$, $V_B$ and $V_C$ from a local source in accordance with a particular formula to arrive at a composite voltage, referred to as $V_\alpha$, which is used for the frequency estimation. The present system results in a more reliable and accurate system frequency determination. If local voltage sources, either primary or alternate, are not available, the system has the capability of selecting remotely originated frequency information for operation of the protective device.

Although a preferred embodiment of the invention has been disclosed here for purposes of illustration, it should be understood that various changes, modifications and substitutions may be incorporated without departing from the spirit of the invention, which is defined by the claims which follow.

What is claimed is:

1. A system for determining power system frequency for use in a protective relay operating to protect or monitor the power system, comprising:
    means for obtaining three phase voltages on the power line by elements which are local to the protective relay;
    a calculating circuit for producing a composite voltage of the three phase voltages using a preselected equation wherein one or more of the three phase voltages are not applied to the calculating circuit in the event of the occurrence of selected power system conditions;
    a scaler circuit for changing the magnitude output of the calculating circuit depending upon which phase voltages are applied to the calculating circuit; and
    means for estimating the power system frequency from the composite voltage, wherein said power system frequency is used by the protective relay in its protective functions for the power system.

2. A system of claim 1, including means for maintaining the estimated power system frequency determined by the estimating means without further change for a time in response to an indication of a system transient or a trip signal produced by the protective relay.

3. A system of claim 1, wherein the three phase voltages are provided by a primary local source or an alternative local source, selectable by the user.

4. A system of claim 1, including a switch for selecting a remotely generated source of system frequency in the event that the local three phase voltages are not available.

5. A system of claim 1, wherein the scaler circuit changes the magnitude output of the calculating circuit to maintain the magnitude of the input to the frequency estimating means substantially constant over time.

6. A system of claim 1, wherein the preselected circuit conditions are A) an open pole condition for the phase voltage not applied, B) a three pole open condition or C) a loss of potential condition.

7. A system of claim 1, wherein the preselected equation is $$V_\alpha = \left[V_A - \left(\frac{V_B + V_C}{2}\right)\right] \cdot K$$

wherein $V_\alpha$ is the composite voltage, K is the scaler quantity and $V_A$, $V_B$, and $V_C$ are the three phase voltages, respectively.

8. A system for determining power system frequency for use in a protective relay operating to protect or monitor the power system, comprising:
    means for obtaining three phase voltages on the power line by elements which are local to the protective relay;
    a calculating circuit for producing a composite voltage of the three phase voltages using the following equation:

$$V_\alpha = \left[V_A - \left(\frac{V_B + V_C}{2}\right)\right] \cdot K$$

where $V_\alpha$ is the composite voltage, K is a scaler quantity and $V_A$, $V_B$, and $V_C$ are the three phase voltages, respectively.

9. A system of claim 8, wherein the scaler quantity changes the magnitude output of the calculating circuit to maintain the magnitude of the input to the frequency estimating means substantially constant over time.

* * * * *